United States Patent [19]

Tomlinson et al.

[11] 4,117,320
[45] Sep. 26, 1978

[54] DIGITAL MEASURING INSTRUMENTS

[75] Inventors: Ernest Valdur Tomlinson; Charles Nicholas Carne, both of London, England

[73] Assignee: Carson (Instruments & Equipment) Limited, London, England

[21] Appl. No.: 693,984

[22] Filed: Jun. 8, 1976

[51] Int. Cl.$^2$ ............................................. H01J 3/14
[52] U.S. Cl. ........................ 250/237 G; 250/231 SE; 340/347 P
[58] Field of Search ................ 250/237 G, 231 SE; 356/169; 340/347 P; 324/175, 156; 235/92 R, 92 EV; 73/431

[56] References Cited

U.S. PATENT DOCUMENTS

| | | | |
|---|---|---|---|
| 2,995,705 | 8/1961 | Walker et al. | 250/237 G |
| 3,693,024 | 9/1972 | Hulle et al. | 250/231 SE |
| 3,757,128 | 9/1973 | Vermeulen | 250/231 SE |
| 3,912,926 | 10/1975 | Coulbourn | 250/231 SE |
| 3,967,271 | 6/1976 | Day | 340/347 P |
| 3,995,156 | 11/1976 | Angersbach et al. | 250/237 G |
| 4,010,464 | 3/1977 | Wires et al. | 340/347 P |

Primary Examiner—David C. Nelms
Assistant Examiner—Vincent J. Sunderdick
Attorney, Agent, or Firm—Ladas, Parry, Von Gehr, Goldsmith & Deschamps

[57] ABSTRACT

A digital instrument produces a continuous digital readout representative of the linear movement of a member positioned by a rotatable shaft. The instrument comprises equally spaced markings formed on an element carried by a bushing intended to be secured to the shaft. Sensing means cooperate with the markings and produce an output pulse in response to the passage of a marking past the sensing means. The output pulses are counted by a reversible digital counter the count of the counter being displayed by digital display means. The electronic circuitry is carried by two printed circuit boards each of which supports a bearing for the bushing. A fixed casing fixedly supports the sensing means, the counter, the display means and the printed circuit boards.

14 Claims, 6 Drawing Figures

DIGITAL MEASURING INSTRUMENTS

This invention relates to a digital measuring instrument and is particularly applicable but not exclusively applicable to a digital measurement instrument for use on a machine tool.

Most movements on a machine tool are measured by a mechanical dial situated on the shaft of a hand wheel which is rotatable to create the movement. Such a dial generally has numbers and sub-divisions around its circumference which cooperate with a fixed marking; as with any ruler parallax errors can occur. Moreover, an absolute reading can only be determined within one revolution of the wheel. Accumulated revolutions must be measured by an independent means. Such a dial assembly is normally set to zero by unlocking the dial, rotating the dial until it is in the appropriate position and then relocking the dial. Dual dials in an assembly of this knid are known to provide readings both in the imperial and metric scales. In this case, the two dials are coupled together through an intermediate gear transmission and the dials rotated at different speeds. Of course in an instrument of this kind there must be provided a fixed marking on the body of the machine.

It is an object of this invention to provide a digital instrument designed to be secured to a shaft rotatable to cause linear movement of a member, the instrument being settable to give a continuous digital reading of the movement of that member either in imperial or metric dimensions.

According to this invention there is provided a digital instrument for cooperating with a shaft rotatable to cause linear movement of a member to give a continuous digital readout representative of the motion of the member, the instrument comprising equally spaced markings formed on an element intended to be secured to the shaft, sensing means which cooperate with the markings, the sensing means being arranged to produce an output pulse in response to the passage of a marking past the sensing means, a reversible digital counter to which the output of the sensing means is connected, digital display means connected to the digital counter, and a casing which is intended to be fixed, which fixedly supports the sensing means, the counter and the display means and which rotatable supports the element.

The counter is desirable resettable to zero.

Preferably the sensing means comprises a fixed radiation source and a fixed radiation sensor, the markings being arranged to pass between the radiation source and the radiation sensor. Preferably there is provided for the sensing means a fixed element on which is formed markings and disposed adjacent to the rotatable element, the markings on the fixed element being arranged to cooperate with the first-mentioned markings to control the radiation falling, in use, upon the radiation sensor.

Preferably the sensing means is duplicated, the pair of sensing means cooperating within any markings being spaced by a distance corresponding to a 180° phase shift based on the pitch of the markings, the outputs of each pair of sensing means being connected to a circuit for adding those outputs in opposition.

Preferably the sensing means are duplicated by further sensing means which cooperate with the same markings and which are disposed at a distance corresponding to a 90° phase shift based on the pitch of the associated markings, the output of the pair of sensing means being connected to a circuit which detects the direction of rotation of the markings. Alternatively the markings are divided into first and second sets of markings, the markings of the two sets being spaced by the same distance with the markings of the first set offset by a distance corresponding to 90° of the pitch of the markings with respect to the markings of the second set, the sensing means being duplicated to cooperate with the first and second sets of markings, the outputs of the pair of sensing means being connected to a circuit for indicating the direction of rotation of the markings.

Preferably there is provided a detector connected to the output of the direction indicator circuit, the detector circuit being connected to the counter and being arranged to prevent the counter counting the first pulse subsequent to a change of direction of rotation.

The instrument may be settable to give a continuous digital readout in either imperial or metric dimensions, and comprise first and second equally spaced markings formed on the same element or different elements intended to be secured to the shaft, first and second sensing means, which are normally fixed and which cooperate with the first and second markings respectively, each sensing means being arranged to produce an output pulse in response to the passage of an associated marking past that sensing means, selector means for selecting one of the sensing means and applying the output of that sensing means to the digital counter, the distance between each adjacent pair of first markings being arranged to correspond to movement of the said member through a distance which is a fraction of an inch and the distance between each adjacent pair of second markings being arranged to correspond to movement of the member through a distance which is a fraction of a meter.

In use, when the shaft is rotated to move the member and, assuming the first sensing means is selected, the count of the counter is increased by a number related to the number of first markings which have passed the first sensing means. Thus the increase in the count of the counter as displayed by the display means corresponds to the movement of the said movable member in terms of inches.

The preferred digital instrument in accordance with this invention has the advantage over mechanical measuring assemblies having two rotatable dials firstly that the backlash between the dials through an intermediate gear is eliminated, secondly high speeds in the intermediate gear are not encountered and thirdly a continuous digital readout is provided.

The digital instrument may be designed to fit any machine tool without any major alteration in the construction of the hand wheel by simple replacement of the existing dial.

A digital measuring instrument in accordance with this invention should not be confused with known digital instruments for use in machine tools as the known digital readout instruments for use in machine tools directly measure the linear movement of a member for example the table of a milling machine independently of any drive to that member. These known digital instruments are highly accurate since there is no backlash at any point in contrast to a measurement based on the hand wheel. However these known digital instruments are relatively expensive. Neither should the digital instrument in accordance with this invention be confused with other instruments which may take the source of measurement from the drive to the member but where the subsequent electronics and display are not integral with the measuring device but are remote from it.

In a conventional machine tool a single rotation of the hand wheel normally corresponds to a specific movement of a particular member for example the table. For example a single rotation of the hand wheel may correspond to movement of the table through 3 mms, 6 mms, ⅛ inch, ¼ inch etc. In the case of the preferred instrument in accordance with this invention assuming that a single rotation of the hand wheel corresponds to 0.025 inch there may be provided 250 first markings so that when the instrument is set to select the first sensing means it can measure movement to the accuracy of 0.001 inches whereas had the second sensing means been selected, the movement would have been measured in metric units to an accuracy of 0.01 millimeters.

A self-contained digital measuring instrument in accordance with this invention will now be described, by way of example only, with reference to the accompanying drawings of which:

Figure 4:
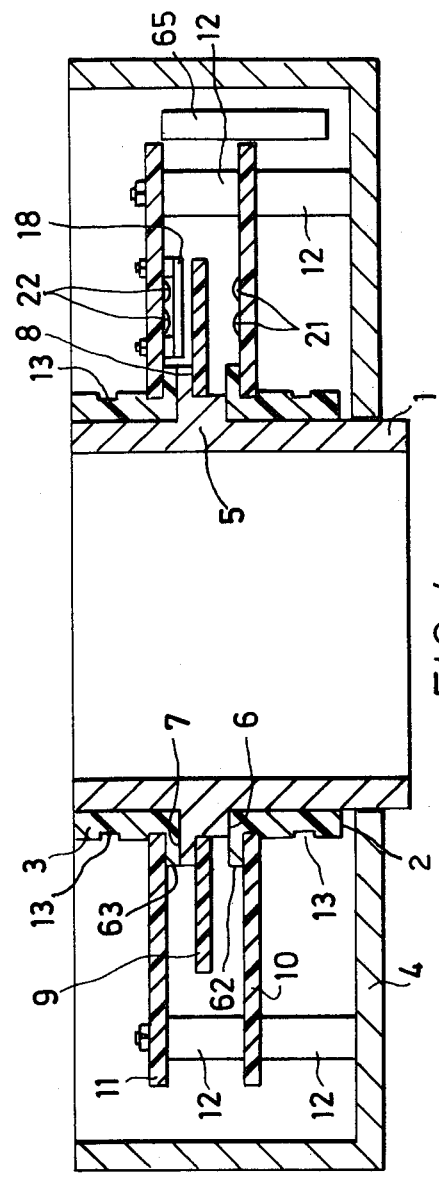
FIG. 4 is a sectional elevation of part of the instrument as mounted on a shaft.

The digital measuring instrument in accordance with this invention is intended for use with a machine tool and is intended to be mounted on the shaft which couples the hand wheel to the movable table of the machine. For this purpose the instrument has, as illustrated in FIG. 4, a bush 1 which fits over the hand wheel shaft and is secured to the shaft by means of an engaging rib and groove arrangement which is not illustrated. The shaft 1 rotates within fixed bearings 2 and 3 carried by the casing 4 of the instrument. The bush 1 is formed with a stepped flange 5 having two outer shoulders 6 and 7 engageable with the journal bearings 2 and 3 respectively so as to locate the casing 4 in relation to the shaft 1; further the flange 5 is formed with an intermediate shoulder 8 to which a transparent disc 9 is secured by adhesive.

Figures 5, 6:
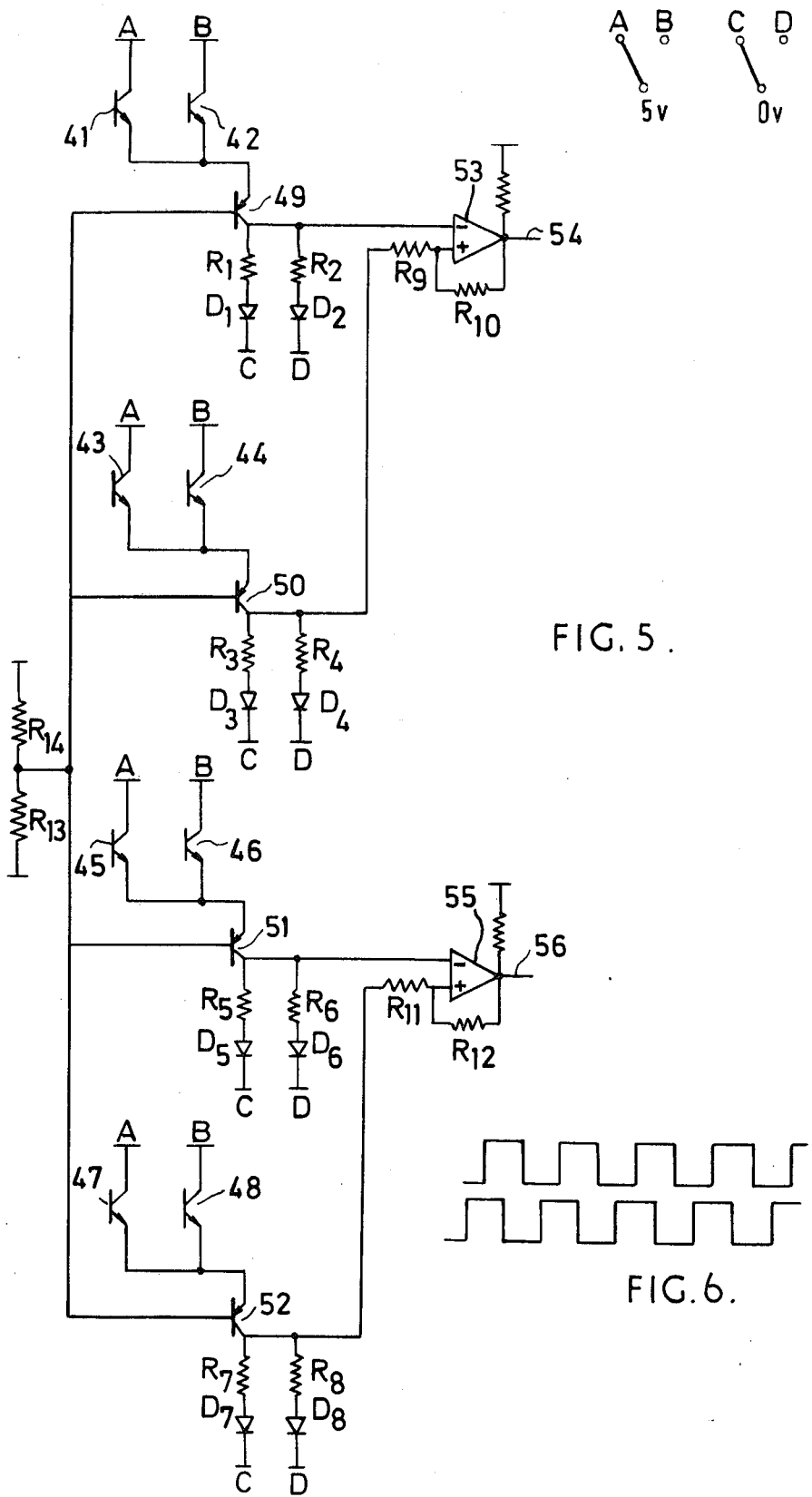
FIG. 5 is a circuit diagram of one of the units shown in the block diagram of FIG. 1.
FIG. 6 shows output signals occurring in the circuit shown in FIG. 5.

A pair of printed circuit boards 10 and 11 surround the bush 1 and are held transverse to the axis of the bush 1 by means of spacers 12 which secure the printed circuit boards 10 and 11 to the casing 4. The printed circuit boards 10 and 11 are secured by adhesive to flanges 62 and 63 of the bearings 2 and 3 respectively; also annular grooves 13 are formed in the external surfaces of the bearings 2 and 3 for keying the resinous "potting" material referred to later. The transparent disc has marked on it four sets 14, 15, 16 and 17 of equally spaced radial lines, the sets 14 and 15 being intended for measuring the movement of the table in millimeters; the radial lines 15 are 90° out of phase with the radial lines 14 and similarly the radial lines 17 are 90° out of phase with the radial lines 16. A mask 18 is carried by the printed circuit board 11 so as to lie parallel and adjacent to the transparent disc 9; the mask 18 has two pairs of slits 19 and 20. Slits 19 cooperate with the lines 14 and 15 whereas the slit 20 cooperate with the lines 16 and 17. For the pitch of the lines 14 and 15 the slits 19 are 180° out of phase and, similarly for the pitch of the lines 16 and 17 the slit 20 are 180° out of phase. A total of eight light sources 21 are carried by the printed circuit board 10 and emit light towards the transparent disc 9 and cooperate with a corresponding number of light sensors 22 located behind the mask 18 and carried by the printed circuit board 11. A pair of light source and light sensor groups are associated with each set of radial lines 14, 15, 16 and 17 and are in register either with the slit 19 or with the slit 20. Thus assuming the light sources associated with the inches are illuminated and the disc 9 rotates four light sensors 22 will be cyclically illuminated and non-illuminated and will produce a pseudo-sine wave output. The two sine wave outputs of the light sensors 22 associated with the radial lines 14 will produce sine waves in phase opposition and these sine waves are added in opposition and amplified to produce a square wave output. A similar output results from the sensors associated with the radial lines 15 but this output is 90° out of phase with the previously mentioned output and these two outputs are illustrated in FIG. 6.

When the light sources and light sensors associated with the metric measurement are connected it is the light sensors 22 associated with the radial sets of lines 16 and 17 which produce outputs which again have a phase difference of 90°.

The reason why it is necessary to produce two outputs separated by a 90° phase difference is that it is necessary to detect the direction of rotation.

Referring now to FIG. 4 the light sources 21 are shown in this figure diagrammatically on the opposite side of the disc 9 to the sensors 22. All the electronic circuits shown in FIG. 4 are mounted on the printed circuit boards 10 and 11 which may be "potted". The outputs of the sensors 22 are fed through a circuit 23 which converts the sine waves into square waves and produces two outputs having a 90° phase difference as has already been explained. The two outputs of the circuit 23 are fed to a direction detector and pulse generator circuit 24 which provides on a line 25 pulses to be counted and these pulses being applied to an arithmetic unit 26. The arithmetic unit 26 divides the input pulses on line 25 by a factor of 2 if an imperial measurement is to be made but effects no division if a metric measurement is to be made. The output pulses are fed to a conventional binary reversible counter 27 whose output is displayed by a display 28 which may be of conventional type. The circuit 24 also produces an output along the line 29 indicative of the direction of motion of the disc 9. This output is fed to direction change detector 30 which also receives the pulse output of the arithmetic unit 26 and serves to inhibit the first pulse applied to the reversible counter 27 after a change of direction of rotation of the disc 9.

The signal on line 29 is also fed to a circuit 31 the function of which is to indicate the sign of the count and also to control the direction of count of the counter 27. It will be appreciated that the required direction of count of the counter 27 for a given direction of rotation of the disc 9 depends on the sign of the count. The circuit 31 receives a zero detection signal from the counter 27 along the line 32 whenever the count of the counter 27 goes through zero. The circuit 31 produces a first output on a line 33 depending upon the known sign of the count already in the counter 27 and the direction of rotation of the disc 9 as measured by the output signal along the line 29 and this output controls the direction of count of the counter 27. The circuit 31 also applies a signal to the line 34 indicative of the sign of the count and this line is connected to a display indicating whether the count is positive or negative.

The arithmetic unit 26, the direction change detector 30 and the circuit 31 are all set when the display is set to zero.

For a machine which normally operates on imperial measurements that is to say its table moves through a distance which is an integral number of thousandths of an inch for a single rotation of the hand wheel, for example 0.025 inches, the required number of lines in the sets 14 and 15 is an integer so that that number of lines can be provided. For such a machine for the required number of lines in the sets 16 and 17 is also an integer which can be provided. However for a metric machine that is to say a machine which causes a movement of the cable through an integral number of millimeters or hundredths of a millimeter for a single rotation of the hand wheel, for example 3 millimeters, the required number of lines in the sets 16 and 17 is an integer which can be provided but it is not possible to provide the required number of lines for the sets 14 and 15 as this number is not an integer. It is of course possible to improve the accuracy by increasing the number of lines in the sets of lines 14 and 15 by a factor of 10 but in this case it will be necessary to provide an electronic division by 10 and in any event a residual inaccuracy would remain. The residual inaccuracy could be overcome by incorporating a circuit to increase the count of the counter 27 by 1 when the counter has counted a specific number and this would only be done when the apparatus is set to operate in the imperial measurement mode.

It would be possible to use very close lines and to use Moire fringes to detect the motion of the disc 9. However this requires great accuracy of positioning of the disc 9 and of the mask 18 and any wobble or misalignment would cause difficulties.

The bearings 2 and 3 are of low pressure plastic, e.g. nylon, impregnated with molybdenum disulphide.

Although the instrument is of unitary construction that is to say the display and the counters etc. are all contained within the casing 4 a separate power supply unit is supplied. Alternatively a battery supply is incorporated within the casing 4.

Figure 1:
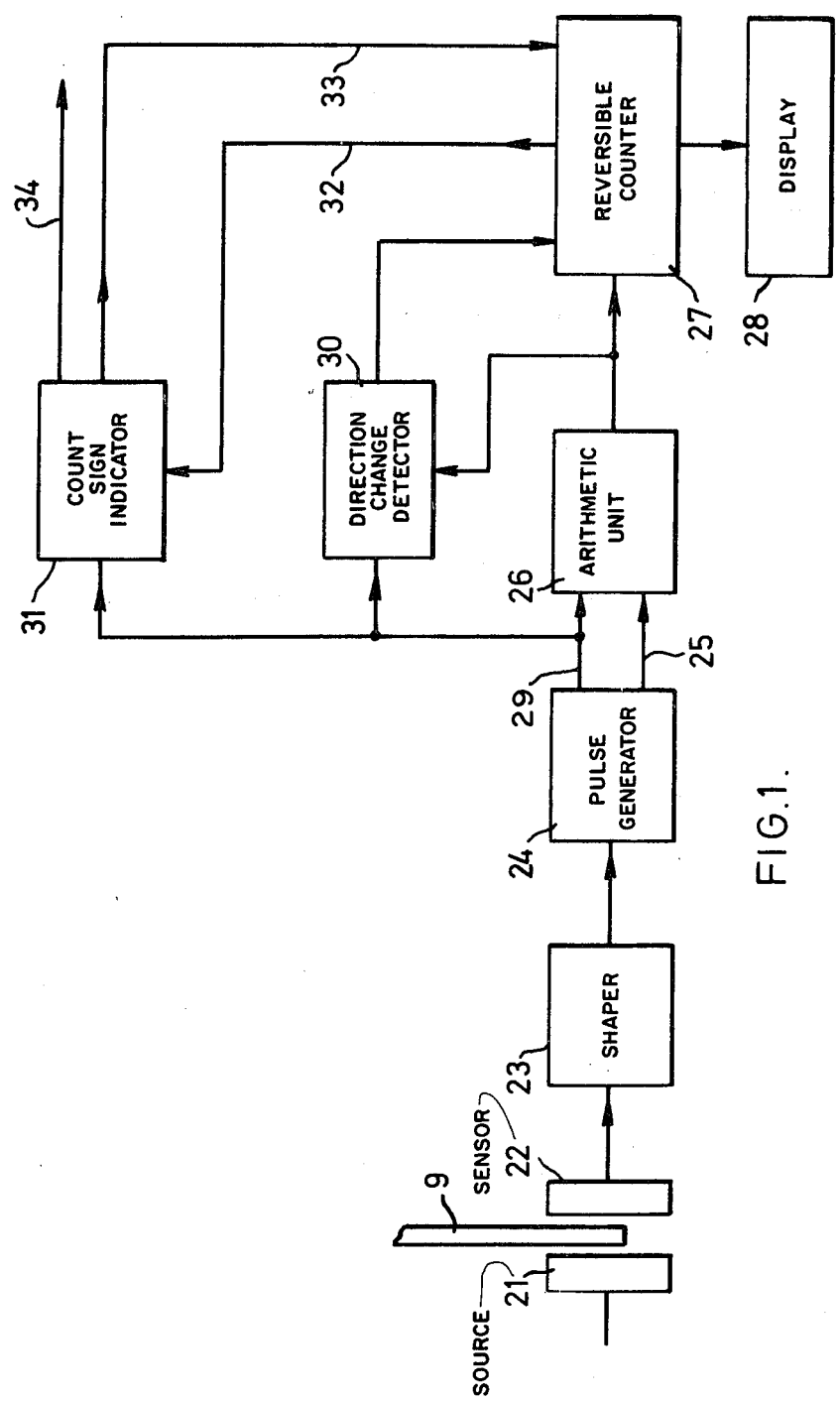
FIG. 1 is a block diagram of the digital instrument.
Figure 2:
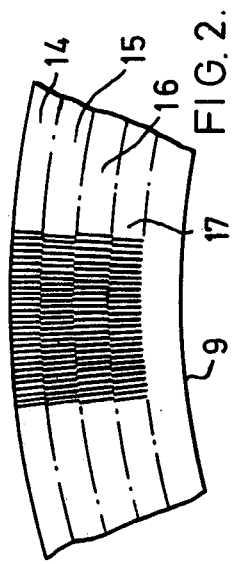
FIG. 2 is a partial drawing of a transparent disc carrying sets of radial lines.
Figure 3:
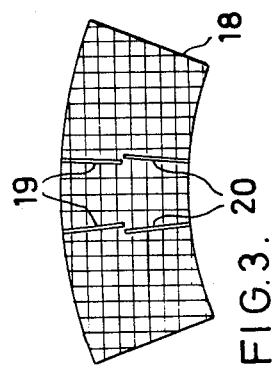
FIG. 3 is a plan view of a mask formed with slits.

FIG. 5 shows a simplified circuit diagram of one of the circuits within the block 23 in FIG. 1. The light sources designated in FIG. 4 by numeral 21 are not shown and are controlled by a separate circuit. There are eight light detectors in the form of transistors 41 to 48 and all designated by numeral 22 in FIG. 4. Transistors 41, 43, 45 and 47 are concerned with the measurement in inches whereas transistors 42, 44, 46 and 48 are concerned with metric measurement. Specifically transistors 41 and 43 cooperate with set of lines 14, transist transistors 45 and 47 and cooperate with a set of lines 15. Similarly transistors 42 and 44 cooperate with lines 16 whereas transistors 46 and 48 cooperate with lines 17. The collectors of transistors 41 and 42 are connected to potentials A and B respectively where emitters are connected to the emitter of a transistor 49. The collector of the transistor 49 is connected firstly through a resistor $R_1$ and a diode $D_1$ to potential C and secondly through a resistor $R_2$ and a diode $D_2$ to a potential D. A potential is either applied between terminals A and C or between terminals B and D so that either transistor 41 is energised or transistor 42 is energised. The other transistors and diodes are similarly connected so that by either selecting terminals A and B or terminals C and D metric or imperial measurement is selected. The transistors of the other three groups of circuits are denoted by 50, 51 and 52 respectively. The transistors 49, 50, 51 and 52 receive a common bias potential at their bases. The collectors of the transistors 49 and 50 are connected to the inputs of an operational amplifier, that is to say, a high gain differential amplifier the output of which appears at the point 54. Assuming that the terminals A and B are selected the sensors constituted by transistors 41 and 43 cooperate with the line 14 and produce outputs which are 180° out of phase. These outputs are added in opposition and amplified by the amplifier 53 to produce a square wave output at a terminal 54. Similarly the transistors 45 and 47 constituting the sensors which cooperate with the lines 15 produce outputs in antiphase which are added by the amplifier 55 to provide an output at the terminal 56 which is a square wave at a phase of 90° to the output at terminal 54.

The casing 4 has a transparent window (not indicated) through which the display 65 is visible; display 65 is carried by the casing 4.

The slits 19 and 20 may each be duplicated by one or more similar slits at a phase shift of 300° or a multiple thereof. Instead of transmitting light through the disc under the control of the lines, the lines may reflect light. Further the light can be replaced by other radiation.

Instead of using radiation, the lines could be replaced by magnetic strips which cooperate with the sensors. Any other line strip or marking sensing arrangements could be used.

We claim:

1. A digital instrument for cooperating with a shaft rotatable to cause linear movement of a member to give a continuous digital readout representative of the motion of the member, the instrument comprising equally spaced markings formed on an element, a bushing intended to be secured to the shaft and which carries the element, sensing means which cooperate with the markings and produce an output pulse in response to the passage of a marking past the sensing means, a reversible digital counter to which the output of the sensing means is connected, digital display means connected to the digital counter, and a casing which is intended to be fixed, which contains and fixedly supports the sensing means, the counter and the display means and which contains the element.

2. A digital instrument as claimed in claim 1 wherein the sensing means comprises a fixed radiation source and a fixed radiation sensor, the markings on the element being arranged to pass between the radiation source and the radiation sensor.

3. A digital instrument as claimed in claim 3 wherein the sensing means comprises a fixed element on which is formed markings and disposed adjacent to the rotatable element, the markings on the fixed element being arranged to cooperate with the markings on the rotatable element to control the radiation falling, in use, upon the radiation sensor.

4. A digital instrument as claimed in claim 1 wherein the sensing means is duplicated, the pair of sensing means cooperating within any markings being spaced by a distance corresponding to a 180° phase shift based on the pitch of the markings, the outputs of the pair of sensing means being connected to a circuit for adding those outputs in opposition.

5. A digital instrument as claimed in claim 1 wherein the markings are divided into first and second sets of markings, the markings of the two sets being spaced by the same distance with the markings of the first set offset by a distance corresponding to 90° of the pitch of the markings with respect to the markings of the second set, the sensing means being duplicated to cooperate with the first and second sets of markings, the outputs of the pair of sensing means being connected to a circuit which indicates the direction of rotation of the markings.

6. A digital instrument as claimed in claim 5 which comprises a detector circuit connected to the output of the direction indicator circuit, the detector circuit being connected to the counter and being arranged to prevent the counter counting the first pulse subsequent to a change of direction of rotation.

7. A digital instrument as claimed in claim 5 which comprises a control circuit connected to the output of the direction indicator circuit and connected to receive an output of the counter indicative of the count of the counter passing through zero, the said control circuit being arranged to produce a control output for the counter to control its direction of count.

8. A digital instrument as claimed in claim 7 wherein the control circuit controls a display indicating the sign of the count of the counter.

9. A digital instrument as claimed in claim 1 which is settable to give a continuous digital readout in either imperial or metric dimensions, and which comprises first and second equally spaced markings formed on the element means intended to be secured to the shaft, first and second sensing means, which are normally fixed and which cooperate with the first and second markings respectively, each sensing means being arranged to produce an output pulse in response to the passage of an associated marking past that sensing means, selector means for selecting one of the sensing means and applying the output of that sensing means to the digital counter, the distance between each adjacent pair of first markings being arranged to correspond to movement of the said member through a distance which is a fraction of an inch and the distance between each adjacent pair of second markings being arranged to correspond to movement of the member through a distance which is a fraction of a meter.

10. A digital instrument as claimed in claim 1 which comprises a bearing for the bushing, and a printed circuit board which supports the bearing and which is supported by the casing.

11. A digital instrument as claimed in claim 10 which comprises two bearings for the bushing and two printed circuit boards, each of which supports one bearing and is supported by the casing.

12. A digital instrument as claimed in claim 11 which comprises one element in the form of a disc, which is parallel to, and lies between, the two printed circuit boards.

13. A digital instrument as claimed in claim 12 wherein the sensing means comprises a fixed radiation source and a fixed radiation sensor, the markings on the element being arranged to pass between the radiation source and the radiation sensor and one printed circuit board carries the radiation sources and the other carries the radiation sensors.

14. A digital instrument as claimed in claim 1 wherein the counter is resettable to zero.

* * * * *